United States Patent
Hofmann et al.

(10) Patent No.: US 6,349,052 B1
(45) Date of Patent: Feb. 19, 2002

(54) DRAM CELL ARRANGEMENT AND METHOD FOR FABRICATING IT

(75) Inventors: Franz Hofmann; Till Schloesser, both of Munich (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 09/660,453

(22) Filed: Sep. 12, 2000

(30) Foreign Application Priority Data

Sep. 13, 1999 (DE) .......................................... 199 43 760

(51) Int. Cl.[7] ................................................. G11C 5/06
(52) U.S. Cl. .......................... 365/63; 365/149; 257/301
(58) Field of Search ................... 365/63, 149; 257/302, 257/301, 300

(56) References Cited

U.S. PATENT DOCUMENTS

| | | | |
|---|---|---|---|
| 5,164,917 A | * 11/1992 | Shichijo | 365/149 |
| 5,245,205 A | * 9/1993 | Higasitani et al. | 257/296 |
| 5,661,063 A | 8/1997 | Lee | 437/32 |
| 5,888,864 A | 3/1999 | Koh et al. | 438/253 |
| 5,902,118 A | 5/1999 | Hübner | 438/106 |
| 6,038,164 A | * 3/2000 | Schulz et al. | 365/154 |
| 6,044,009 A | * 3/2000 | Goebel et al. | 365/149 |

FOREIGN PATENT DOCUMENTS

| DE | 19746448 A1 | 4/1998 |
|---|---|---|
| EP | 0852396 A2 | 7/1998 |

* cited by examiner

Primary Examiner—Michael S. Lebentritt
Assistant Examiner—Tuan T. Nguyen
(74) Attorney, Agent, or Firm—Young & Thompson

(57) ABSTRACT

A capacitor of a memory cell is produced in a depression (V) in a first substrate (1). The first substrate (1) is connected to a second substrate (2) in such a way that an insulating layer (I) is arranged between them. The second substrate (2) is thinned. A transistor of the memory cell is produced in the second substrate (2). In order to connect the transistor to the capacitor a first trench (G1) is produced, which trench cuts through the insulating layer (I). By means of isotropic etching, part of the insulating layer (I) which is arranged between the transistor and the capacitor is removed and replaced by a contact (K).

4 Claims, 6 Drawing Sheets

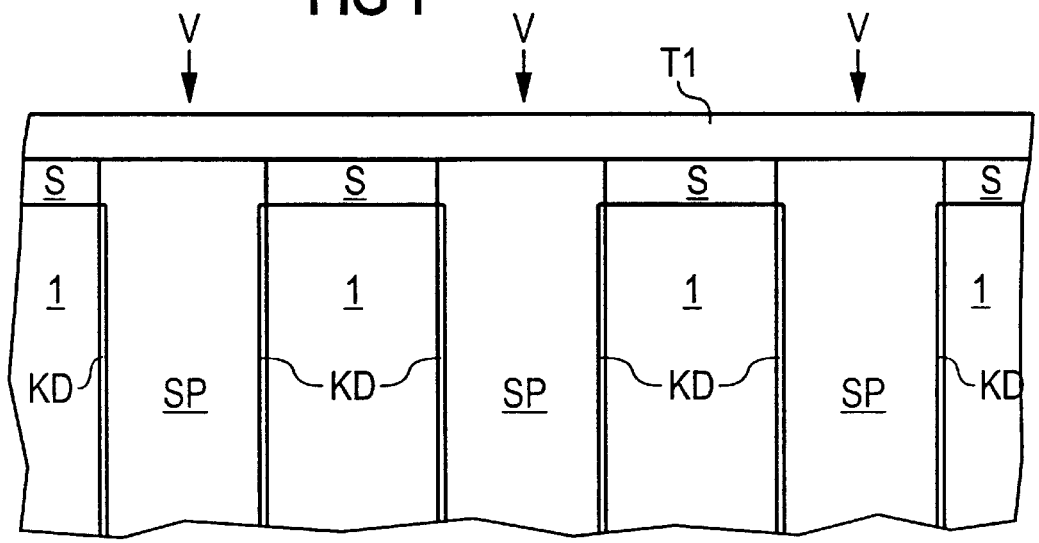
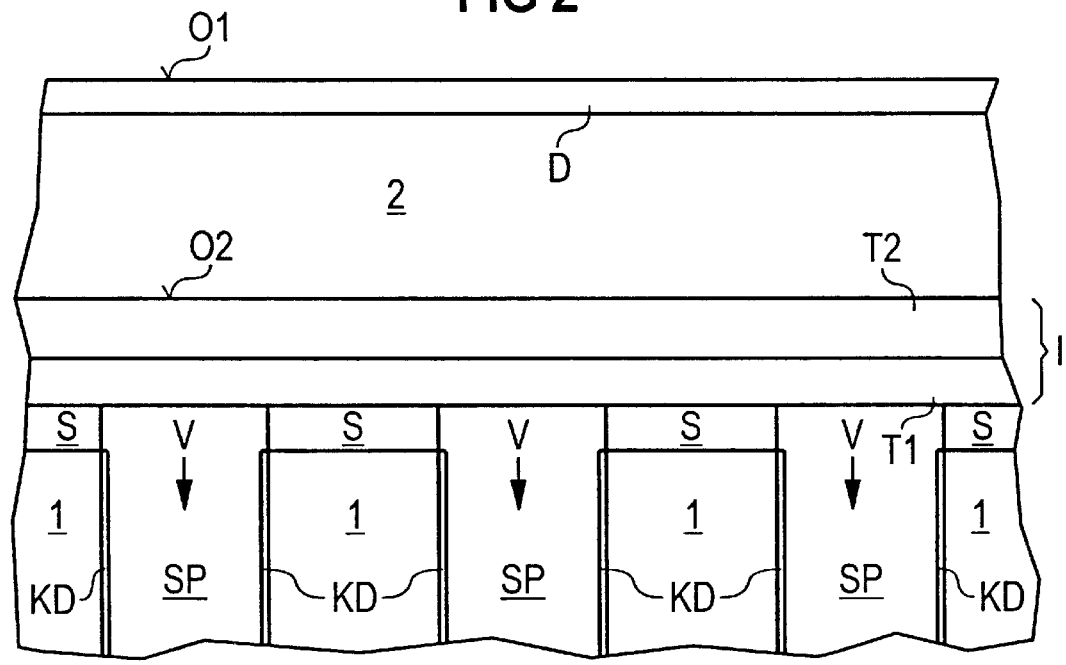

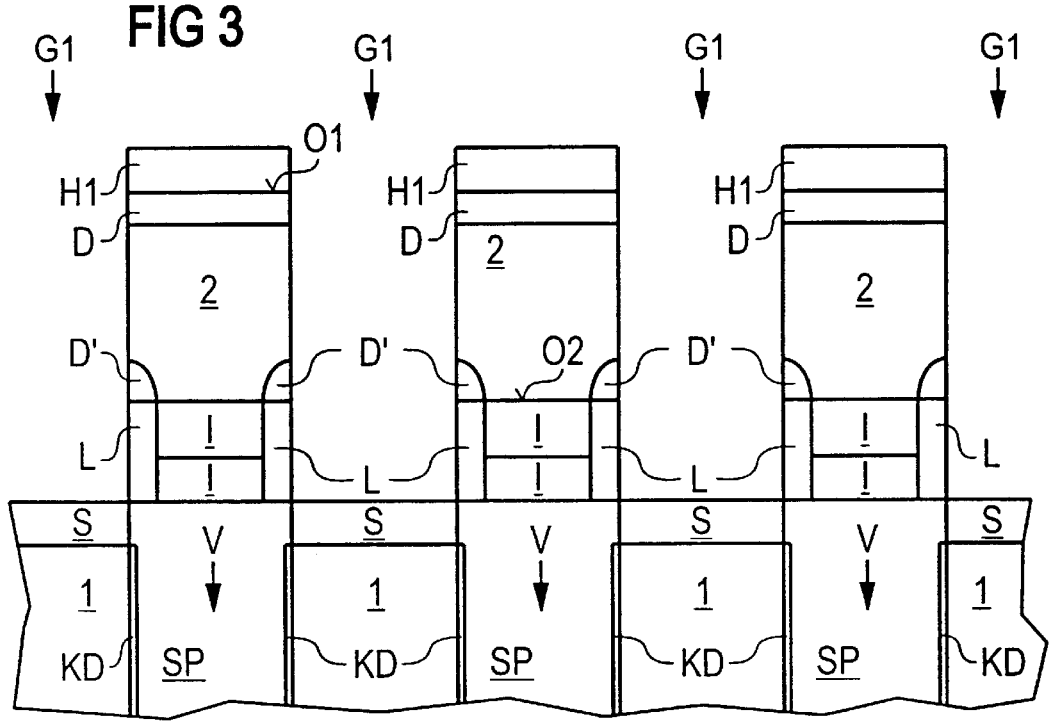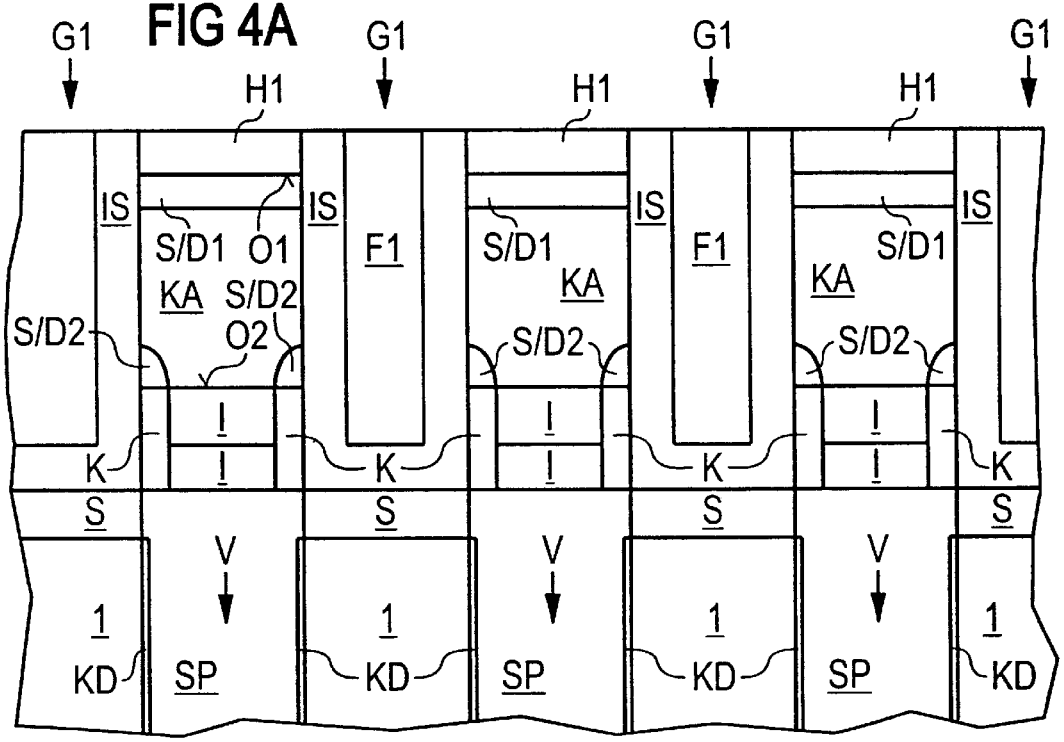

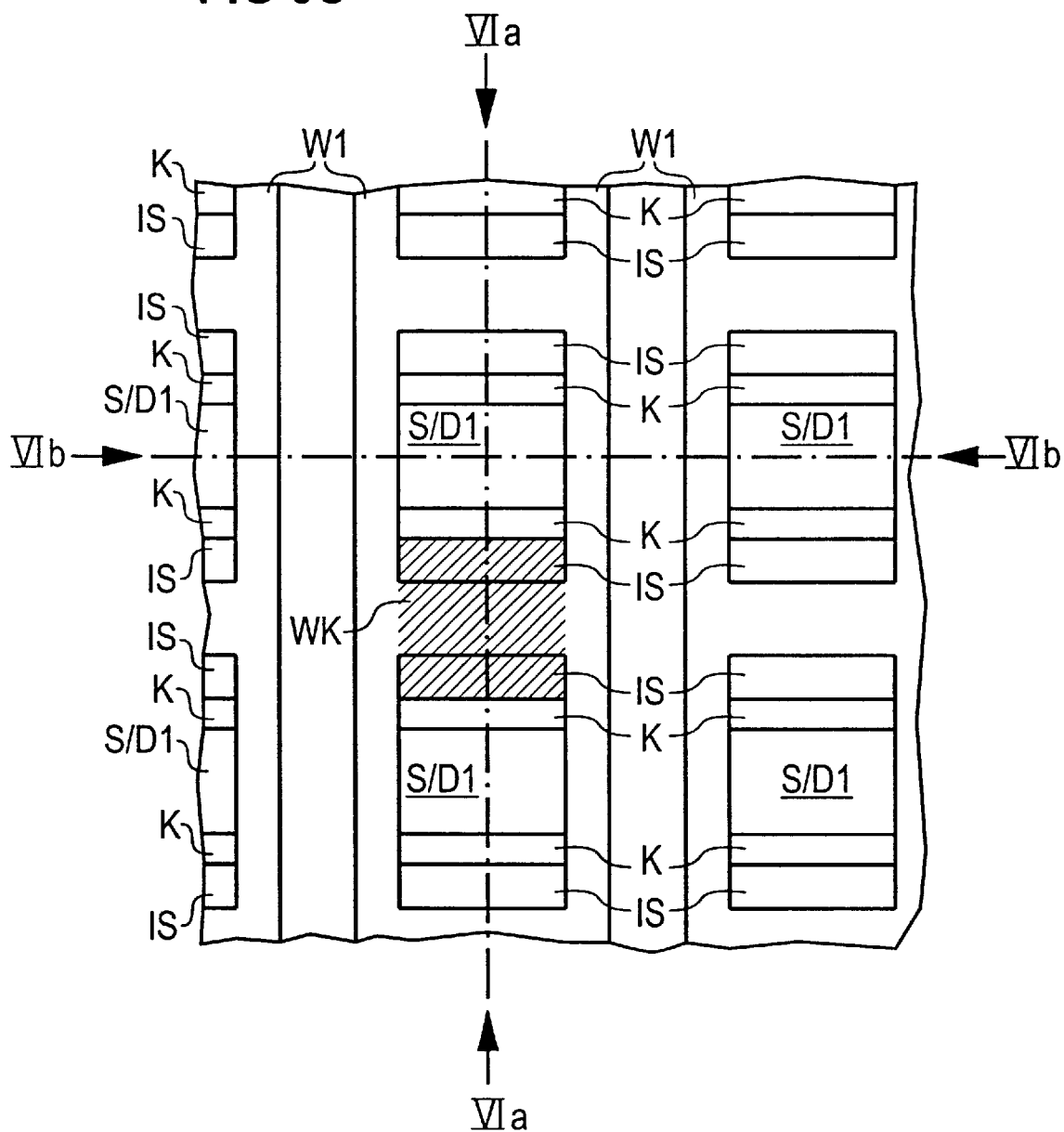

DRAM CELL ARRANGEMENT AND METHOD FOR FABRICATING IT

FIELD OF THE INVENTION

The invention relates to a DRAM cell arrangement, that is to say a dynamic random access memory cell arrangement, and a method for fabricating it.

BACKGROUND OF THE INVENTION

At the present time it is almost exclusively the case that a so-called 1-transistor memory cell comprising one transistor and one capacitor is used as the memory cell of a DRAM cell arrangement. The information of the memory cell is stored in the form of a charge on the capacitor. The capacitor is connected to the transistor in such a way that when the transistor is driven via a word line, the charge of the capacitor can be read out via a bit line.

Such a DRAM cell arrangement is described e.g. in EP 0852396 A2. A storage node of the capacitor and, above it, a gate electrode of the transistor, said gate electrode being isolated from the capacitor, are arranged in a depression in a substrate. In an upper region of the storage node, the storage node directly adjoins the substrate where a source/drain region of the transistor is arranged. A further source/drain region of the transistor is arranged at a surface of the substrate, with the result that the transistor is configured as a vertical transistor. Apart from the region in which the storage node adjoins the source/drain region of the transistor, in an upper region the storage node is isolated from the substrate by a so-called collar. In remaining regions the storage node is isolated from the substrate by a capacitor dielectric. A heavily doped region which adjoins the capacitor dielectric and serves as a capacitor plate of the capacitor is arranged in the substrate. This region is produced by diffusion of dopants into the substrate, said dopants being introduced into the depression before the storage node is produced.

U.S. Pat. No. 5,902,118 describes a three-dimensional circuit arrangement produced by two substrates being stacked one on top of the other and connected, said substrates having components in the region of their interfaces which meet one another. One of the substrates is subsequently thinned from the rear side, the other substrate acting as a stabilizing support plate.

SUMMARY OF THE INVENTION

The invention is based on the problem of specifying a DRAM cell arrangement in which transistors of memory cells can have fewer leakage currents in comparison with the prior art in conjunction with a high packing density of the DRAM cell arrangement. Furthermore, the intention is to specify a method for fabricating such a DRAM cell arrangement.

The problem is solved by means of a DRAM cell arrangement having memory cells each comprising a transistor and a capacitor. A first substrate has one depression per memory cell. Areas of the depression are provided with a capacitor dielectric of the capacitor of the memory cell. The depression is filled with a storage node of the capacitor. The transistor of the memory cell is arranged in a second substrate. A first source/drain region of the transistor adjoins at least a first surface of the second substrate. A second source/drain region of the transistor adjoins at least a second surface, opposite to the first surface, of the second substrate. The first substrate and the second substrate are connected to one another in such a way that an insulating layer is arranged between them, which insulating layer adjoins the storage node and the second surface of the second substrate. The second substrate has first trenches, which isolate source/drain regions of mutually adjacent transistors from one another and which each cut through the second substrate and the insulating layer. At least one contact is arranged in the insulating layer, which contact adjoins one of the first trenches, the second source/drain region and the storage node. Bit lines and word lines running transversely with respect thereto are provided, which are connected to the memory cells.

The problem is furthermore solved by means of a method for fabricating a DRAM cell arrangement, in which a plurality of memory cells are produced. One depression is produced per memory cell in a first substrate. Areas of the depression are provided with a capacitor dielectric of a capacitor of the memory cell. The depression is filled with a storage node of the capacitor. The first substrate is connected to the second substrate, an insulating layer being produced which is arranged between said substrates and adjoins the storage node and the second substrate. The second substrate is thinned from a first surface, the first surface being opposite to a second surface, adjoining the insulating layer, of the second substrate. A first source/drain region of a transistor of the memory cell is produced in such a way that it adjoins at least the first surface of the second substrate. First trenches are produced in the second substrate, which trenches each cut through the second substrate and the insulating layer, parts of the insulating layer which adjoin the first trenches also adjoining the storage nodes of the capacitors of the memory cells. A second source/drain region of the transistor is produced in such a way that it adjoins at least one of the first trenches and at least one of the parts of the insulating layer. The parts of the insulating layer are removed by isotropic etching. The parts of the insulating layer are replaced by contacts by conductive material being deposited and etched back. Bit lines and word lines running transversely with respect thereto are produced and are connected to the memory cells.

The first trenches cut through the insulating layer in order that the parts of the insulating layer which are arranged underneath the second source/drain regions can be removed during the isotropic etching.

During the thinning of the second substrate, the first substrate acts as a stabilizing support plate.

The DRAM cell arrangement can have a high packing density since the transistor is arranged above the capacitor and the contact does not require any additional space but rather is arranged below the transistor. The first trenches, which serve for isolating the source/drain regions of the mutually adjacent transistors, are also used for producing the contacts between the transistors and the capacitors. The isotropic etching enables the contacts to be produced in a laterally offset manner with respect to the first trenches, so that they are arranged underneath the second source/drain regions.

Since the transistor and the capacitor are produced in different substrates, the production of the depression, which is generally effected by anisotropic etching, does not have any adverse effects on the transistor, with the result that the latter can have fewer leakage currents. By way of example, defects which can arise during the production of the depressions in the first substrate do not impair the transistors since the transistors are produced in a different, the second, substrate. The process steps for producing the capacitor can be optimized without having to consider the transistor. The transistors also do not have to be considered when choosing the material for a mask for producing the depressions. By way of example, the mask may be produced from metal.

Since the storage node does not adjoin the first substrate, the complicated production of a collar can be dispensed with. It suffices for all areas of the depression to be provided with the capacitor dielectric.

Since only the capacitors but not the transistors of the DRAM cell arrangement are arranged in the first substrate, a capacitor electrode of the capacitors can be produced in a manner other than by diffusion of dopant into the first substrate, said dopant being introduced into the depression. By way of example, the entire first substrate may be composed of heavily doped monocrystalline silicon or polysilicon and form the capacitor electrode. This means a significant reduction in the process complexity.

A particularly high packing density can be obtained if the transistor is configured as a vertical transistor. To that end, the second source/drain region is arranged below the first source/drain region. A channel region of the transistor is arranged between the first source/drain region and the second source/drain region.

Although the capacitor and the transistor are arranged one above the other, dimensions of the capacitor can be chosen independently of dimensions of the transistor, since the transistor and the capacitor are not arranged in a single depression. Thus, the capacitor may have a horizontal cross section without corners, while the gate dielectric adjoins a planar lateral area of the channel region. This has the advantage that the capacitor dielectric is arranged on curved areas without edges, thereby avoiding field distortions and resultant leakage currents. At the same time, said area of the channel region is planar, with the result that it has a defined orientation with regard to the crystal lattice of the substrate, which enables the gate dielectric to grow homogeneously.

In order to simplify the process, and also in order to increase the packing density, it is advantageous to arrange the first source/drain region and the second source/drain region between two of the first trenches in such a way that they adjoin these first trenches. This can be done in a self-aligned manner, i.e. without masks to be aligned, by the first source/drain region and/or the second source/drain region being produced by patterning doped layers arranged in the second substrate by means of the first trenches. The first source/drain region can also be produced by implantation of the second substrate after the first trenches have been produced.

In order to simplify the process, and also in order to reduce the electrical resistance between the storage node and the second source/drain region, at least one further contact may be arranged in the insulating layer. One contact adjoins one of the two first trenches, while the further contact adjoins the other of the two first trenches. The fabrication method is particularly simple since the isotropic etching can be effected without a mask. It is clear that, in this case, two parts of the insulating layer are removed under each transistor, since ultimately two first trenches also adjoin the transistor and two parts of the insulating layer under said transistor are laterally uncovered.

A particularly low electrical resistance results if the further contact also connects the second source/drain region to the storage node. If, however, only one contact is intended to be provided per transistor, then a mask can protect a side wall of each of the first trenches during the isotropic etching, with the result that only one part of the insulating layer is removed for each first trench.

To ensure that the further contact does not adjoin the first substrate and cause a short circuit in the event of misalignment of the transistor with respect to the storage node, it is advantageous to provide a protective layer arranged on the first substrate, the depression cutting through said protective layer. Consequently, in the event of misalignment, the further contact adjoins the protective layer and is isolated from the first substrate by the protective layer. The protective layer is arranged between the insulating layer and the first substrate.

An even smaller resistance between the storage node and the second source/drain region can be obtained if more than two contacts are provided. By way of example, in addition to the two first trenches, the transistor may be arranged between second trenches which likewise cut through the insulating layer, so that four contacts can be produced. If the first trenches and the second trenches completely surround the transistor, then the four contacts are contiguous and form an annular contact structure.

It lies within the scope of the invention to produce the first trenches in such a way that they have a, for example, square horizontal cross section.

The first trenches may have a strip-shaped horizontal cross section and run essentially parallel to one another. The second substrate may have second trenches which run essentially parallel to one another and transversely with respect to the first trenches, isolate the source/drain regions of mutually adjacent transistors from one another, cut through the second substrate and reach down to the insulating layer, without cutting through the latter. Lateral areas of the second trenches are provided with a gate dielectric in the region of the channel region. Gate electrodes of the transistors are at least partially arranged in the second trenches and adjoin the gate dielectric.

The word lines are connected to the gate electrodes and preferably run parallel to the second trenches.

Since the second trenches do not cut through the insulating layer, two contacts or, in the case of masked isotropic etching, one contact are/is produced per transistor. Since the gate electrodes are arranged in the second trenches, while the contacts adjoin the first trenches, capacitances between the gate electrodes and the contacts are avoided. As an alternative, the gate electrodes are arranged in the first trenches.

Each transistor is surrounded by two of the first trenches and by two of the second trenches. The first source/drain regions and the second source/drain regions respectively adjoin two of the first trenches and two of the second trenches.

The space requirement of a memory cell may be $4F^2$, where F is the minimum feature size that can be fabricated in the technology used.

The contacts may firstly be produced as parts of conductive structures which are patterned at a later point in time. By way of example, the production of the first trenches running parallel to one another may be followed by the performance of the isotropic etching, so that said uncovered parts of the insulating layer are removed. The parts of the insulating layer are subsequently replaced by the conductive structures. Such a conductive structure has a strip-shaped horizontal cross section, runs parallel to the first trenches and adjoins a side wall of the first trenches. The second trenches can then be produced, which trenches do not cut through the insulating layer. Since the second substrate is etched in this case, parts of the conductive structures are uncovered. These uncovered parts of the conductive structures can be removed and replaced by insulating material, with the result that the mutually isolated contacts are formed from the remaining parts of the conductive structures.

The gate electrodes may be connected to the word lines which run above the second substrate.

As an alternative, the gate electrodes may be parts of the word lines.

By way of example, the word lines fill the second trenches. To ensure that a word line does not drive two transistors which are adjacent transversely with respect to the word line, a side wall of each of the second trenches may in each case be provided with a structure which prevents a channel from being formed. Such a structure may be, for example, a heavily doped region which is arranged in the second substrate and has the same conductivity type as the channel region. As an alternative, the structure is produced from insulating material introduced into the second trench.

As an alternative, the word line may consist of two parts. By way of example, spacers made of conductive material, which form the word lines, run along the side walls of the second trenches. Since, in this case, two sides of the channel region are provided with the gate dielectric and adjoin the word line, the channel width of the transistor is particularly large, with the result that a particularly large amount of current can flow through the transistor. The spacers can be produced by conductive material being deposited and etched back until the bottoms of the second trenches are uncovered.

If the channel width of the transistor is not intended to be so large, it lies within the scope of the invention to provide only every second trench with spacers. The word line is thus in one part and consists of a spacer. In order to fabricate such word lines, the second trenches in which no word lines are intended to be produced may be filled with an auxiliary structure. Conductive material is subsequently deposited and etched back until the bottoms of the second trenches are uncovered.

A further possibility for producing the word lines in a self-aligned manner, i.e. without the use of masks to be aligned, parallel to the second trenches is described below:

The first trenches and the second trenches are produced in such a way that they have the same width. In the first trenches but not in the second trenches, insulating structures are arranged at least on side walls of the first trenches, with the result that two mutually opposite parts of the insulating structures are arranged between in each case two transistors which are adjacent to one another along one of the second trenches. The gate electrode is part of the word line which laterally surrounds the channel region. The word line is in the form of a spacer within the second trenches, while it adjoins the mutually opposite parts of the insulating structures in the first trenches. In this case, too, the channel width is large since the word line is arranged on two areas of the channel region.

Such a word line can be produced in a self-aligned manner since on account of the insulating structures, the first trenches are constricted by the insulating structures outside the second trenches. If, to produce the word lines, conductive material is deposited which has a thickness such that the first trenches are filled outside the second trenches but the second trenches are not filled, and if it is subsequently etched back until bottoms of the second trenches are uncovered, then the conductive material remains contiguous within the first trenches and along the second trenches.

In order to produce such a DRAM cell arrangement, the production of the conductive structures is followed by the production of the insulating structures, which initially cover the side walls of the first trenches but do not fill the first trenches. During the production of the second trenches, parts of the insulating structures are removed in such a way that bottoms of the second trenches are essentially planar. This produces the insulating structures which are arranged within the first trenches but outside the second trenches and have parts that are opposite to one another.

The principle of producing the word lines in a self-aligned manner if the effective width of the first trenches outside the second trenches is less than the width of the second trenches can also be used when the first trenches are produced with a smaller width than the second trenches right at the very beginning. In this case, it is possible to dispense with the insulating structures which constrict the first trenches. The channel region can be provided with a gate dielectric in the region of the first trenches as well, with the result that the gate electrode of the transistor annularly surrounds the entire channel region and the transistor consequently has a particularly large channel width.

The insulating structures can be produced by insulating material being deposited essentially conformally and being removed outside the first trenches. The first trenches can then be filled with dummy structures. During the production of the second trenches, parts of the dummy structures and of the insulating structures which are arranged in the second trenches are removed with the aid of a trench mask as far as a level reached by the insulating layer. During the production of the second trenches, the second substrate is additionally etched until the insulating layer and the parts of the conductive structures are uncovered. The second trenches consequently have essentially planar bottoms. The uncovered parts of the conductive structures are removed and replaced by insulating material by the insulating material being deposited to a thickness such that the second trenches are filled, and then, in order to enable the word lines to be produced, being etched back together with the dummy structures as far as a level which is suitable for the word lines. The word lines are then produced.

During the etching back of the dummy structures and of the insulating material, etching is effected selectively with respect to the insulating structures. A lattice-shaped depression having an essentially planar bottom is produced. The level which is suitable for the word lines is located at the level reached by an upper area of the insulating layer, or somewhat higher. The dummy structures and the insulating material should not be etched back to a deeper level since otherwise the contacts arranged in the insulating layer might be uncovered. Although the gate dielectric is grown before the word lines are produced, an undesirable capacitance can nonetheless form between the contacts and the word lines. The suitable level is also not located significantly above the level reached by the insulating layer since the word lines, for driving the transistors, should reach as far as a level of the second source/drain regions, and this level is located in the region of the insulating layer.

The second source/drain regions may be produced for example by diffusion of dopant from the contacts into the second substrate. In this case, the contacts or the conductive structures are produced from doped polysilicon. If two contacts are provided per transistor, then the second source/drain region may be in two parts.

If the word lines are intended to be produced in two parts in the form of two spacers, then the dummy structures are not concomitantly etched back during the etching back of the insulating material for the purpose of replacing the parts of the conductive structures.

In order to connect the two substrates to one another, a first partial layer of the insulating layer, which covers the storage nodes, may be applied on the first substrate. A second partial layer of the insulating layer is applied on the second surface of the second substrate. The partial layers are preferably planarized by e.g. chemical mechanical polishing. The substrates are subsequently pressed together, the two partial layers meeting one another. Heat treatment at approximately 900° C. causes the two partial layers to bond permanently to one another and form the insulating layer.

However, the insulating layer may also be applied as a whole on the first substrate or on the second substrate.

The storage node may be composed of a metal or a metal silicide, e.g. tungsten silicide, in a lower region. An upper region of the storage nodes is preferably composed of doped polysilicon.

The bit lines may adjoin the first source/drain regions and run parallel to the first trenches.

In order to increase the conductivity of the word lines, it is possible to provide lines which are arranged above the second substrate and are connected to the word lines. One line is provided for each word line. Since those parts of the word lines which are in the form of spacers have small horizontal cross sections, word line contacts which connect the word lines to the lines are preferably arranged over the first trenches, where the word lines have a particularly large horizontal cross section. It is not necessary to provide word line contacts between each pair of transistors adjacent to one another along the second trenches. Contact can be made e.g. after 64 transistors in each case.

In order to avoid a short circuit between the word line contacts and the bit lines, it is advantageous to encapsulate the bit lines by insulating spacers and by an insulating auxiliary layer before the word line contacts are produced. An intermediate oxide is deposited (e.g. borophosphorus silicate glass) in which contact holes to the word lines are opened. In this case, the intermediate oxide is etched selectively with respect to the auxiliary layer and the insulating spacers.

BRIEF DESCRIPTION OF THE DRAWINGS

An exemplary embodiment of the invention is explained in more detail below with reference to the figures.

FIG. 1 shows a cross section through a first substrate after a protective layer, depressions, a capacitor dielectric, storage nodes and a first partial layer of an insulating layer have been produced.

FIG. 2 shows the cross section from FIG. 1 and a cross section through a second substrate after a second partial layer of the insulating layer has been produced on the second substrate, the two substrates have been connected to one another, the second substrate has been thinned and a doped layer has been produced.

FIG. 3 shows the cross section from FIG. 2 after a first auxiliary layer, first trenches, conductive structures and doped regions have been produced.

FIG. 4a shows the cross section from FIG. 3 15 after insulating structures, first dummy structures, second trenches (illustrated in FIG. 4b), first source/drain regions, second source/drain regions and contacts have been produced.

FIG. 4b shows a cross section—perpendicular from the cross section from FIG. 4a—through the two substrates after the process steps from FIG. 4a.

FIG. 5b shows the cross section from FIG. 4b after the process steps from FIG. 5a.

FIG. 6b shows the cross section from FIG. 5b after the process steps from FIG. 6a.

FIG. 6c shows the plan view from FIG. 4c illustrating the contacts, the first source/drain regions, parts of the insulating structures which are arranged on the side walls of the first trenches, the word lines and a word line contact.

DETAILED DESCRIPTION OF THE INVENTION

Figure 4B:
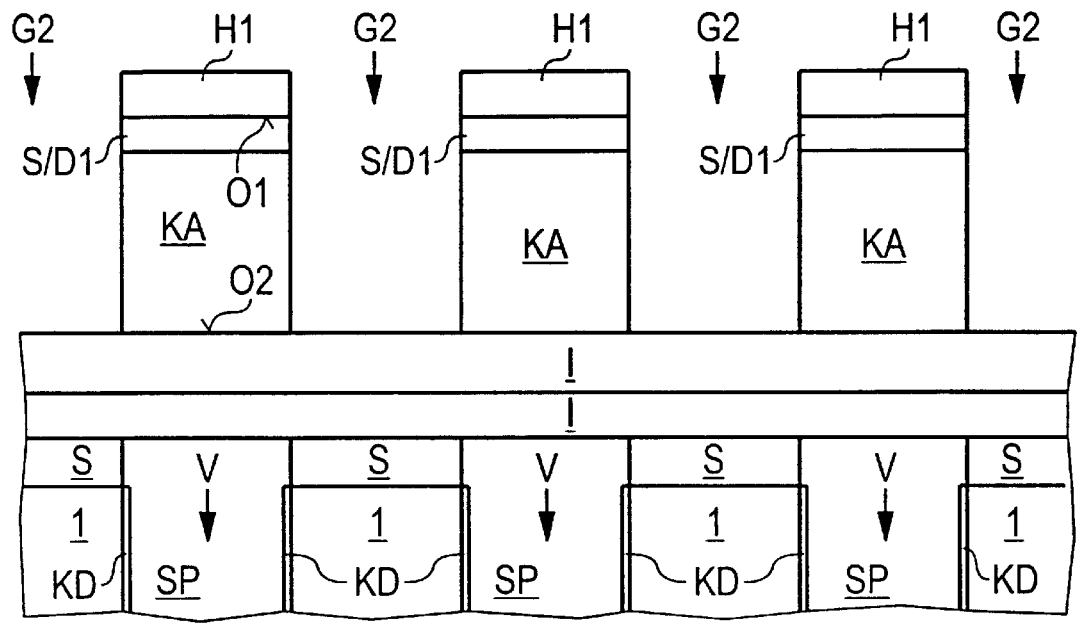

The Figures are not true to scale.

In an exemplary embodiment a first substrate 1 made of n-doped silicon and having a thickness of approximately 400 $\mu$m is provided. The dopant concentration is approximately $10^{20}$ cm$^{-3}$. In order to produce a protective layer S, silicon nitride is deposited to a thickness of approximately 50 nm (see FIG. 1).

By means of masked etching, depressions V having a depth of approximately 6 $\mu$m are produced in the first substrate 1 (see FIG. 1). The depressions V have circular horizontal cross sections whose diameter is approximately 150 nm. The depressions V are arranged in rows and columns. Distances between mutually adjacent depressions V are approximately 150 nm.

In order to produce a capacitor dielectric KD of capacitors, silicon nitride is deposited to a thickness of approximately 5 nm and oxidized by thermal oxidation to a depth of approximately 2 nm (see FIG. 1).

In order to produce storage nodes SP of the capacitors, in situ n-doped polysilicon is deposited to a thickness of approximately 200 nm and planarized by chemical mechanical polishing until the protective layer S is uncovered (see FIG. 1).

In order to produce a first partial layer T1 of an insulating layer I, SiO$_2$ is deposited to a thickness of approximately 200 nm and planarized by chemical mechanical polishing. The first partial layer T1 of the insulating layer I is approximately 100 nm thick.

A second substrate 2 made of p-doped silicon and having a thickness of approximately 400 $\mu$m is provided. The dopant concentration is approximately $10^{17}$ cm$^{-3}$. A second partial layer T2 of the insulating layer I, said partial layer having a thickness of approximately 100 nm, is applied on the second substrate 2 by SiO$_2$ being deposited to a thickness of approximately 200 nm and being planarized by chemical mechanical polishing (see FIG. 2).

The first substrate 1 and the second substrate 2 are stacked onto one another in such a way that the first partial layer T1 impinges on the second partial layer T2 of the insulating layer I. By means of a heat-treatment step at approximately 900° C., the first partial layer T1 and the second partial layer T2 are permanently bonded to one another and form the insulating layer I (see FIG. 2).

The second substrate 2 is subsequently thinned, the first substrate 1 acting as a stabilizing support plate. After being thinned, the second substrate 2 is approximately 1000 nm thick (see FIG. 2).

An n-doped layer D having a thickness of approximately 100 nm is produced in the second substrate 2 by implantation (see FIG. 2). The dopant concentration of the doped layer D is approximately $10^{20}$ cm$^{-3}$. The second substrate 2 has the doped layer D at a first surface O1 and the insulating layer I at a surface O2 opposite to the first surface O1.

In order to produce a first auxiliary layer H1, silicon nitride is deposited to a thickness of approximately 100 nm on the second substrate 2 (see FIG. 3).

With the aid of a first trench mask made of a photoresist (not illustrated), first trenches G1 are produced in the second substrate 2, which trenches cut through the first auxiliary layer H1, the second substrate 2 and the insulating layer I (see FIG. 3).

Parts of the insulating layer I which adjoin side walls of the first trenches G1 are removed by isotropic etching of $SiO_2$ (see FIG. 3). A suitable etchant is HF, for example.

The removed parts of the insulating layer I are replaced by conductive structures L by in situ n-doped polysilicon being deposited to a thickness of approximately 50 nm and being etched back until the protective layer S is uncovered (see FIG. 3).

An oxide (not illustrated) having a thickness of approximately 5 nm is subsequently produced by thermal oxidation. In this case, dopant diffuses from the conductive structures L into the second substrate 2, where it forms strip-shaped doped regions D' (see FIG. 3).

In order to produce insulating structures IS, silicon nitride is deposited to a thickness of approximately 50 nm. $SiO_2$ is subsequently deposited to a thickness of approximately 100 nm, the first trenches G1 thereby being filled. $SiO_2$ and silicon nitride are removed by chemical mechanical polishing until the first auxiliary layer H1 is uncovered. As a result, the insulating structures IS are produced from the silicon nitride, which insulating structures are arranged in the first trenches G1, cover the side walls and the bottoms of the first trenches G1 and have parts situated opposite one another in the first trenches G1. First dummy structures F1 are produced from the $SiO_2$ in the first trenches G1 (see FIG. 4a).

Figure 4C:
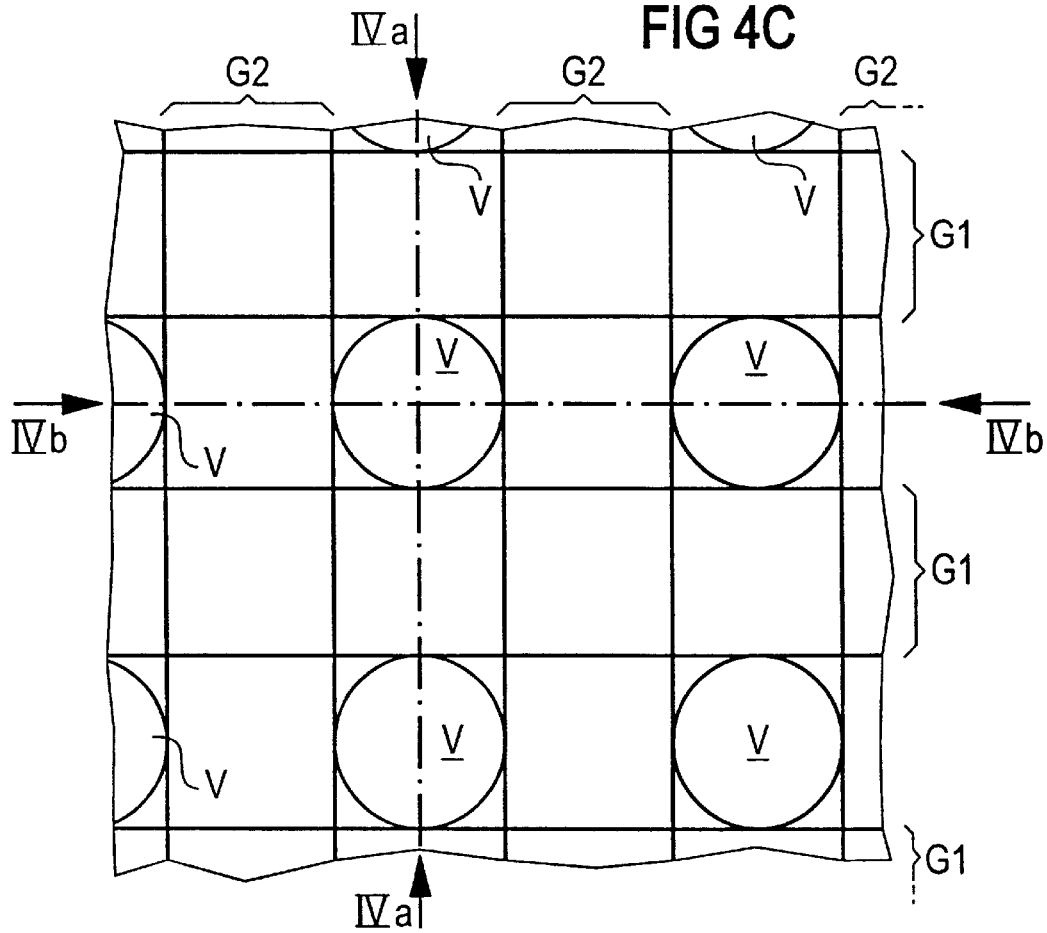
FIG. 4c shows a plan view of the two substrates illustrating the depressions, the first trenches and the second trenches.

With the aid of a second trench mask made of photoresist, second trenches G2 are produced in the second substrate 2 by silicon nitride, silicon and $SiO_2$ being etched until the insulating layer I is uncovered (see FIGS. 4b and 4c).

First source/drain regions S/D1 of transistors are produced from the doped layer D, which is patterned by the first trenches G1 and the second trenches G2. Second source/drain regions S/D2 of the transistors are produced from the doped regions D', which are patterned by the first trenches G1 and the second trenches G2. Parts of the second substrate 2 which are arranged between the first source/drain regions S/D1 and the second source/drain regions S/D2 act as channel regions KA of the transistors.

Through the second trenches G2, parts of the conductive structures L are uncovered on bottoms of the second trenches G2. These parts of the conductive structures L are removed by etching using e.g. He, HBr, $Cl_2$, $C_2F_6$. The conductive structures L are thus patterned and form mutually isolated contacts K which connect the second source/drain regions S/D2 in each case to the storage nodes SP situated underneath (see FIG. 4a).

The removed parts of the conductive structures L are replaced by insulating material by $SiO_2$ being deposited to a thickness of approximately 150 nm, the second trenches G2 thereby being filled, and being subjected to chemical mechanical planarization until the first auxiliary layer H1 is uncovered. The first auxiliary layer H1 is removed by etching using e.g. $CHF_3$, $O_2$. $SiO_2$ is subsequently etched back to a depth of approximately 300 nm, with the result that the bottoms of the second trenches G2 are again situated at their original level. When the $SiO_2$ is etched back, the first dummy structures F1 are also etched back, thereby forming a lattice-shaped depression which laterally surrounds the channel regions KA of the transistors.

A gate dielectric GD having a thickness of approximately 5 nm is produced by thermal oxidation on uncovered areas of the channel regions KA. The gate dielectric GD is arranged on parts of the side walls of the second trenches G2 (see FIG. 5b).

In order to produce word lines W1, in situ n-doped polysilicon is deposited to a thickness of approximately 50 nm, the first trenches G1 thereby being filled, while the second trenches G2 are not filled. Polysilicon is subsequently etched back by an extent of approximately 100 nm until the bottoms of the second trenches G2 are uncovered. The word lines W1 are thus produced from the polysilicon (see FIGS. 5a and 5b).

Figure 5A:
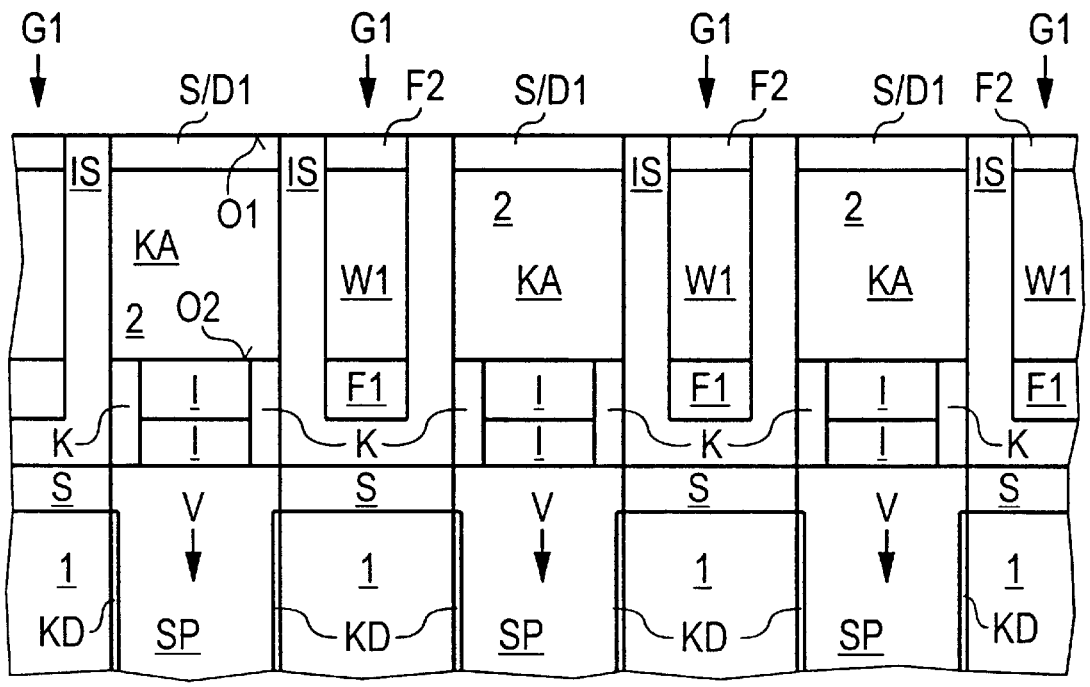
FIG. 5a shows the cross section from FIG. 4a after the first auxiliary layer has been removed and a gate dielectric (illustrated in FIG. 5b), word lines and second dummy structures have been produced.
Figure 5B:
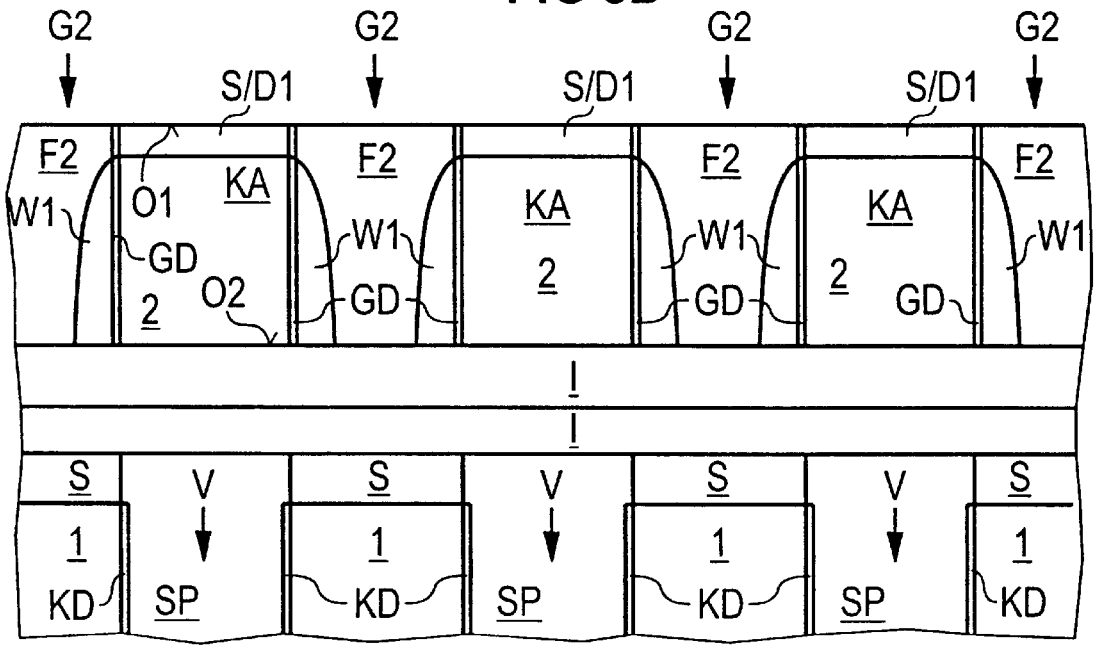

In order to produce second dummy structures F2, $SiO_2$ is deposited to a thickness of approximately 100 nm and planarized by chemical mechanical polishing until the first source/drain regions S/D1 are uncovered (see FIGS. 5a and 5b).

In order to produce bit lines B, tungsten is deposited to a thickness of approximately 100 nm. Silicon nitride is deposited over that to a thickness of approximately 50 nm in order to produce a second auxiliary layer H2.

Figure 6A:
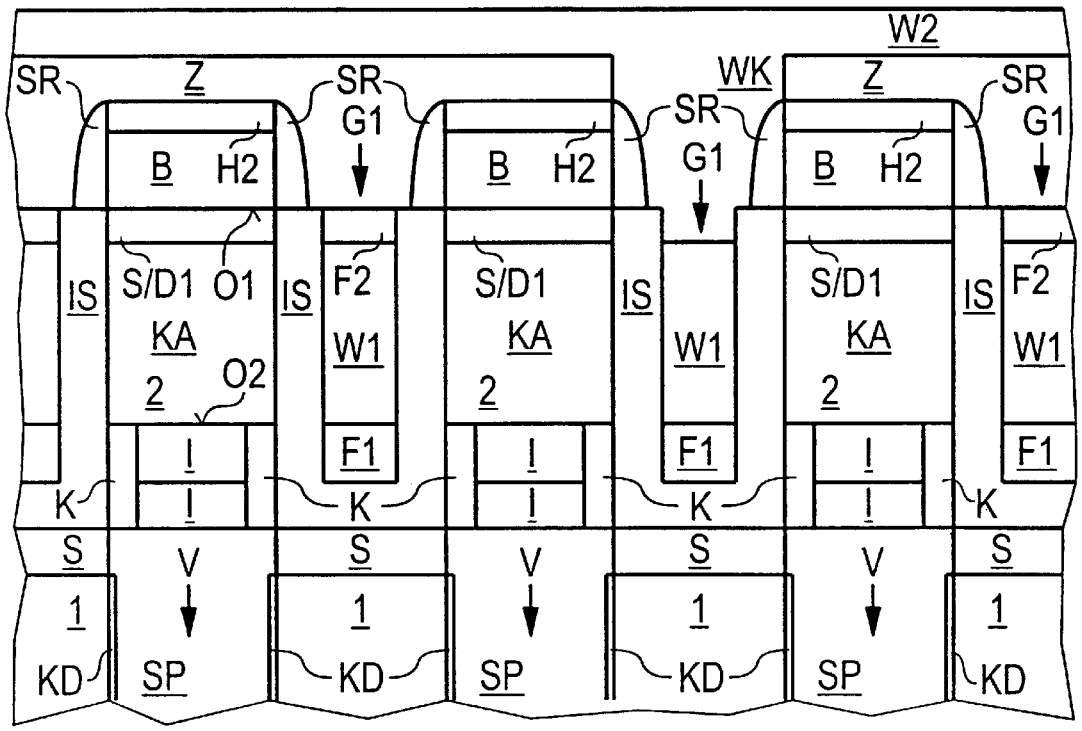
FIG. 6a shows the cross section from FIG. 5a after bit lines, insulating spacers, a second auxiliary layer, an intermediate oxide, word line contacts and lines have been produced.
Figure 6B:
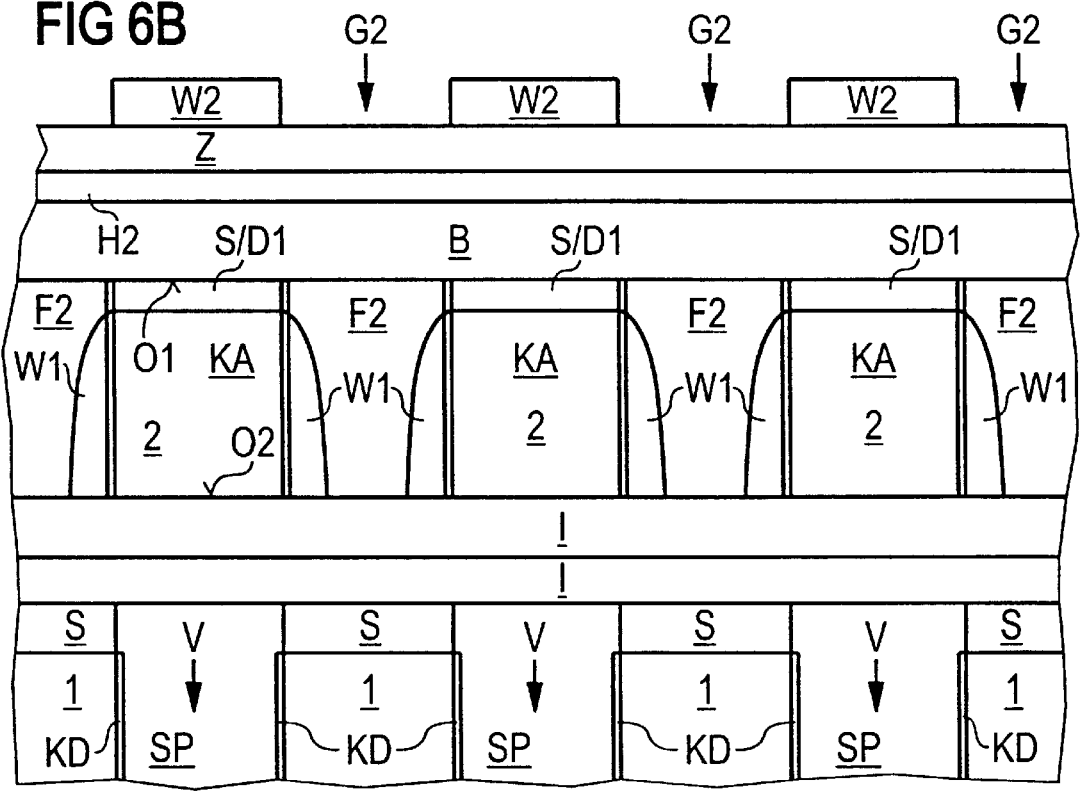

With the aid of a mask made of photoresist, the second auxiliary layer H2 and the tungsten are patterned, the bit lines B thereby being produced from the tungsten, which bit lines are approximately 150 nm wide, run parallel to the first trenches G1, are arranged between the first trenches G1, adjoin the first source/drain regions S/D1 and are covered by the second auxiliary layer H2 (see FIGS. 6a and 6b).

In order to encapsulate the bit lines B, silicon nitride is deposited to a thickness of approximately 30 nm and etched back until the second dummy structures F2 are uncovered. Insulating spacers SR are thus produced from the silicon nitride, which spacers protect the bit lines B laterally (see FIG. 6a).

An intermediate oxide Z having a thickness of approximately 100 nm is subsequently produced by $SiO_2$ being deposited to a thickness of approximately 200 nm and being planarized by chemical mechanical polishing (see FIGS. 6a and 6b).

In order to produce word line contacts WK, contact holes are opened in intermediate oxide Z to parts of the word lines W1 which are arranged in the first trenches G1. Distances between contact holes which are adjacent to one another along the word line W1 are approximately 20 $\mu$m. During the opening of the contact holes, the corresponding second dummy structures F2 are also removed, with the result that the parts of the word lines WI are uncovered. Tungsten is subsequently deposited to a thickness of approximately 200 nm, with the result that the contact holes are filled with the word line contacts WK. Tungsten is patterned with the aid of a mask made of photoresist (not illustrated), lines W2 running parallel to the word lines W1 thereby being produced (see FIGS. 6a and 6b and 6c).

The method described produces a DRAM cell arrangement in which a memory cell comprises a transistor and a capacitor connected thereto.

There are many conceivable variations of the exemplary embodiment which likewise lie within the scope of the invention. Thus, dimensions of the described layers, regions, structures, lines and contacts can be adapted to the respective requirements.

What is claimed is:

1. A DRAM cell arrangement, having memory cells each comprising a transistor and a capacitor, in which a first substrate (1) with a depression (V) is provided, in which areas of the depression (V) are provided with a capacitor dielectric (KD) of the capacitor, in which the depression (V) is filled with a storage node (SP) of the capacitor, in which the transistor is arranged in a second substrate (2), in which a first source/drain region (S/D1) of the transistor adjoins at least a first surface (O1) of the second substrate (2), in which a second source/drain region (S/D2) of the transistor adjoins at least a second surface (O2), opposite to the first surface (O1), of the second substrate (2), in which the first substrate (1) and the second substrate (2) are connected to one another in such a way that an insulating layer (I) is arranged between them, which insulating layer adjoins the storage node (SP) and the second surface (O2) of the second substrate (2), in which the second substrate (2) has first trenches (G1), which isolate source/drain regions (S/D1, S/D2) of mutually adjacent transistors from one another and which each cut through the second substrate (2) and the insulating layer (I), in which at least one contact (K) is arranged in the insulating layer (I), which contact adjoins one of the first trenches (G1), the second source/drain region (S/D2) and the storage node (SP), in which bit lines (B) and word lines (W1) running transversely with respect thereto are provided, which are connected to the memory cells.

2. The DRAM cell arrangement as claimed in claim 1, in which the second source/drain region (S/D2) is arranged below the first source/drain region (S/D1), in which the first source/drain region (S/D1) and the second source/drain region (S/D2) are arranged between two of the first trenches (G1) and adjoin these first trenches (G1), in which at least one further contact (K) is arranged in the insulating layer (I) and adjoins the second source/drain region (S/D2), with the result that the contact (K) adjoins one of the two first trenches (G1) and the further contact (K) adjoins the other of the two first trenches (G1), in which a protective layer (S) is arranged on the first substrate (1), the depression (V) cutting through said protective layer.

3. The DRAM cell arrangement as claimed in claim 2, in which the first trenches (G1) run essentially parallel to one another, in which the second substrate (2) has second trenches (G2) which run essentially parallel to one another and transversely with respect to the first trenches (G1), isolate the source/drain regions (S/D1, S/D2) of mutually adjacent transistors from one another, cut through the second substrate (2) and reach down to the insulating layer (I), in which a channel region (KA) of the transistor is arranged between the first source/drain region (S/D1) and the second source/drain region (S/D2), in which lateral areas of the second trenches (G2) are provided with a gate dielectric (GD) in the region of the channel region (KA), in which gate electrodes of the transistors are at least partially arranged in the second trenches (G2) and adjoin the gate dielectric (GD).

4. The DRAM cell arrangement as claimed in claim 3, in which the first trenches (G1) and the second trenches (G2) have the same width, in which the gate electrodes are part of the word lines (W1), in which, in the first trenches (G1) but not in the second trenches (G2), insulating structures (IS) are arranged at least on side walls of the first trenches (G1), with the result that two mutually opposite parts of the insulating structures (IS) are arranged between in each case two transistors which are adjacent to one another along one of the second trenches (G2), in which the word line (W1) associated with the gate electrode laterally surrounds the channel region (KA), in which the word line (W1) is in the form of a spacer within the second trenches (G2), in which the word line (W1) adjoins mutually opposite parts of the insulating structures (IS) in the first trenches (G1), in which the word line (W1) runs parallel to the second trenches (G2).

* * * * *